(12) United States Patent
Yang

(10) Patent No.: US 7,262,443 B1
(45) Date of Patent: Aug. 28, 2007

(54) SILICIDE UNIFORMITY FOR LATERAL BIPOLAR TRANSISTORS

(75) Inventor: Kevin J. Yang, Santa Clara, CA (US)

(73) Assignee: T-Ram Semiconductor Inc., Milpitas, CA (US)

( * ) Notice: Subject to any disclaimer, the term of this patent is extended or adjusted under 35 U.S.C. 154(b) by 188 days.

(21) Appl. No.: 11/027,401

(22) Filed: Dec. 29, 2004

(51) Int. Cl.
H01L 29/74 (2006.01)

(52) U.S. Cl. .............. 257/162; 257/122; 257/557; 257/E27.079; 257/E29.036; 438/134

(58) Field of Classification Search .......... 257/122, 257/162, 140, E27.079, E29.036
See application file for complete search history.

(56) References Cited

U.S. PATENT DOCUMENTS

| | | | | |
|---|---|---|---|---|
| 5,434,447 | A | * | 7/1995 | Miyashita et al. .......... 257/514 |
| 6,118,171 | A | * | 9/2000 | Davies et al. .............. 257/586 |
| 6,767,770 | B1 | | 7/2004 | Horch et al. |
| 2001/0054746 | A1 | * | 12/2001 | Yamada et al. ............ 257/565 |
| 2002/0100918 | A1 | * | 8/2002 | Hsu et al. .................. 257/200 |

OTHER PUBLICATIONS

S. Matsuda, et al., "Novel Corner Rounding Process for Shallow Trench Isolation utiling MSTS," International Electron Devices Meeting Technical Digest, 1998, pp. 137-140.
Joo-Hyoung Lee et al., "A Study of Stress Induced p+/n Salicided Junction Leakage Failure . . . ," IEEE Transactions on Electron Devices, vol. 49, No. 11, pp. 1985-1992, 2002.

* cited by examiner

Primary Examiner—Jerome Jackson
Assistant Examiner—Paul Budd
(74) Attorney, Agent, or Firm—The Webostad Firm; Howard Morton

(57) ABSTRACT

Method and apparatus for forming a semiconductor device. The method includes defining a plurality of rows in a semiconductor layer. Thereafter, on one or more of the plurality of rows, one or more bipolar junction devices are formed. Each of the bipolar junction devices has a first end region and a second end region. A quantity of a pre-amorphization ion is then implanted into at least one of the first end region and the second end region of a bipolar junction device for example. A silicide is formed in the semiconductor layer at the first end region and the second end region having implanted therein the quantity of the pre-amorphization ion. Additionally, laterally extending upper edges of the plurality of rows forming corners may be rounded prior to the implantation of the pre-amorphization.

8 Claims, 6 Drawing Sheets

SILICIDE UNIFORMITY FOR LATERAL BIPOLAR TRANSISTORS

FIELD OF THE INVENTION

The present disclosure is related to semiconductor devices and, more particularly, to thyristor semiconductor memory devices and their methods of manufacture.

BACKGROUND OF THE INVENTION

Some static random access memory ("SRAM") cell designs may have at least two active elements, one of which may include a Negative Differential Resistance ("NDR") device. Overall performance of this type of SRAM cell may be based in part upon the properties of the NDR device. A variety of NDR devices have been introduced that include either a bipolar transistor or a quantum-effect device. One advantage of an NDR-based cell for an SRAM design may be its potential for allowing a cell area smaller than conventional SRAM cells.

Recently, thyristors have been introduced by T-RAM Inc. of San Jose, Calif., as a type of NDR device for forming a thyristor-based random access memory device. These types of memories can provide speeds approaching conventional SRAM but with circuit density approaching that of dynamic random access memory ("DRAM"). Moreover, such thyristor-based memory may be integrated within a Complimentary-Metal-Oxide-Semiconductor ("CMOS") process flow. Such thyristor-based memory may comprise a thin capacitively coupled thyristor ("TCCT") to form a bi-stable element for an SRAM cell. Additional details regarding a thyristor-based memory device may be found in U.S. Pat. No. 6,767,770 B1, which is incorporated by reference herein in its entirety.

Thyristors may be formed using lateral bipolar transistor technologies as bipolar four-region semiconducting devices, with each region thereof having an alternately n-type or p-type material, for example pnpn. Accordingly, the four regions define three p-n junctions. Terminals, which may be thought of as an anode terminal and a cathode terminal, are used for directing current through the four regions responsive to an input and a control potential. A control terminal, sometimes referred to as a control gate, is selectively capacitively coupled to one of the middle regions responsive to the control potential.

Metal-semiconductor contacts are commonly formed in semiconductor devices by means of a silicide formed as a film of a refractory metal reacted with silicon. Common silicide semiconductor films include but are not limited to metals such as tungsten, titanium, and cobalt. Notably, as used herein, "include" means include without limitation.

An issue with planar transistor fabrication in general, and with the fabrication of thyristor-based devices in particular, is the uniformity of at least some of the silicide features in a given device. With increased non-uniformity in the form of silicide features comes a concomitant increased non-uniformity in current flows between the silicides and one or more of the transistor junctions of the device. This non-uniformity is apparent from device to device within a given die, from die to die within a given wafer, and from wafer to wafer, and has several deleterious results.

FIG. 1 conceptually illustrates some of these silicide non-uniformities. It will be appreciated by those of skill in the art that this figure is solely for illustration of the problems solved herein and does not necessarily reflect the actual fabrication steps or order of fabrication of a given device. In that figure, semiconductor wafer 100 includes a silicon substrate 102 which has formed thereon a layer of buried oxide ("BOx") 104. A layer of silicon 106 formed over BOx layer 104 is subsequently etched to form a shallow trench isolation feature later filled with isolation oxide 108. The formation of the shallow trench feature and the implementation of isolation oxide 108 define a plurality of silicon rows 205. Silicon rows 205 are doped to form four doped regions, a p+region 116, an n region 118, a p region 120, and an n+ region 122. Separating these regions is a series of junctions 117, 119, and 121. Formed over silicon rows 205 and isolation oxide 108 are first and second nitride spacers, 110 and 112 respectively. Formed between silicon nitride spacers 110 and 112 is a polysilicon gate 114, with dielectric layer 135 providing a gate dielectric between polysilicon gate 114 and region 120. Notably, polysilicon gate 114 is a conductive "stripe" that is substantially orthogonal to a trench substantially filled with isolation oxide 108.

As shown in enlarged section AA, the formation depth of silicide 124 results in an electrical path between silicide 124 and junction 117 of distance "A." With reference to enlarged section BB, silicide 128 is formed with a distance "B" resulting between junction 121 and silicide 128. Device-to-device non-uniformity in the formation depth and roughness of silicides 124 and 128 result in non-uniformity in distances "A" and "B", leading to variation in current flow rates between silicide 124 with respect to junction 117 and silicide 128 with respect to junction 121.

A second form of silicide morphology variation which contributes to non-uniform current flow is shown with reference to enlarged section "CC". This section illustrates silicide depth non-uniformity along the isolation junction where silicide 128 extends generally downward, at 129, along the boundary between doped region 122 and isolation oxide 108. This silicide morphology variation again negatively impacts current density uniformity.

A third form of silicide morphology variation, which contributes to non-uniform current flows, is also shown with reference to enlarged sections "AA" and "BB". This is the non-uniform lateral encroachment of silicides, for instance silicides 128 and 124 under overlying structures, for instance nitride spacers 110 and 112. This non-uniform lateral encroachment further exacerbates the non-uniform current flow issue previously discussed, by randomly varying the distances "A" and "B" shown in FIG. 1. Additionally, non-uniform lateral encroachment may occur where silicides are formed in gate structures, for instance as at 130, where a silicide 126 formed in gate 114 encroaches under an overlying portion of spacer 110.

These non-uniformities result in increased variations in device performance. As a result, circuits utilizing these devices must be designed robustly to operate properly over a broader range of operating parameters than would otherwise be necessary.

Accordingly, it would be useful and desirable to form one or more of the several silicides of lateral bipolar devices, including thyristor-based memory devices, in a more uniform or repeatable manner. For example, it would be desirable and useful to form a silicide which exhibits one or more of the following characteristics: a substantially more planar lower boundary surface; substantially improved depth repeatability; substantially reduced silicide morphology variation; and substantially reduced or eliminated lateral encroachment.

SUMMARY OF THE INVENTION

An aspect of the invention is a method for forming a semiconductor device which includes defining a plurality of rows in a semiconductor layer. Thereafter, on at least one of the plurality of rows, at least one bipolar junction device is formed. The bipolar junction device has a first end region and a second end region. A quantity of a pre-amorphization ion is implanted into at least one of the first end region and the second end region. After the pre-amorphization ion is implanted, a silicide is formed along and below an upper surface of the semiconductor layer of the at least one of the first end region and the second end region having implanted therein the quantity of the pre-amorphization ion.

Another aspect of the invention is a semiconductor device including a plurality of rows defined in a semiconductor layer, with at least one bipolar junction device formed on at least one of the plurality of rows. The at least one bipolar junction device has a first end region and a second end region. At least one of the first end region and the second end regions has a quantity of a pre-amorphization ion implanted therein. A silicide is formed in an upper surface of the semiconductor layer and to a finite depth therebelow in the at least one of the first end region and the second end region having implanted therein the quantity of the pre-amorphization ion.

BRIEF DESCRIPTION OF THE DRAWING

The accompanying drawing shows exemplary embodiment(s) in accordance with one or more aspects of the invention; however, the accompanying drawing should not be taken to limit the invention to the embodiment(s) shown, but are for explanation and understanding only. It will be understood that one or more features illustrated in the accompanying drawing are not drawn to scale, for purposes of clarity. In the several figures of the drawing:

FIGS. 2A through 2M are sectional diagrams depicting a portion of a semiconductor wafer during several respective operations of an exemplary process flow for forming a uniform silicide feature on the wafer.

Figure 1:
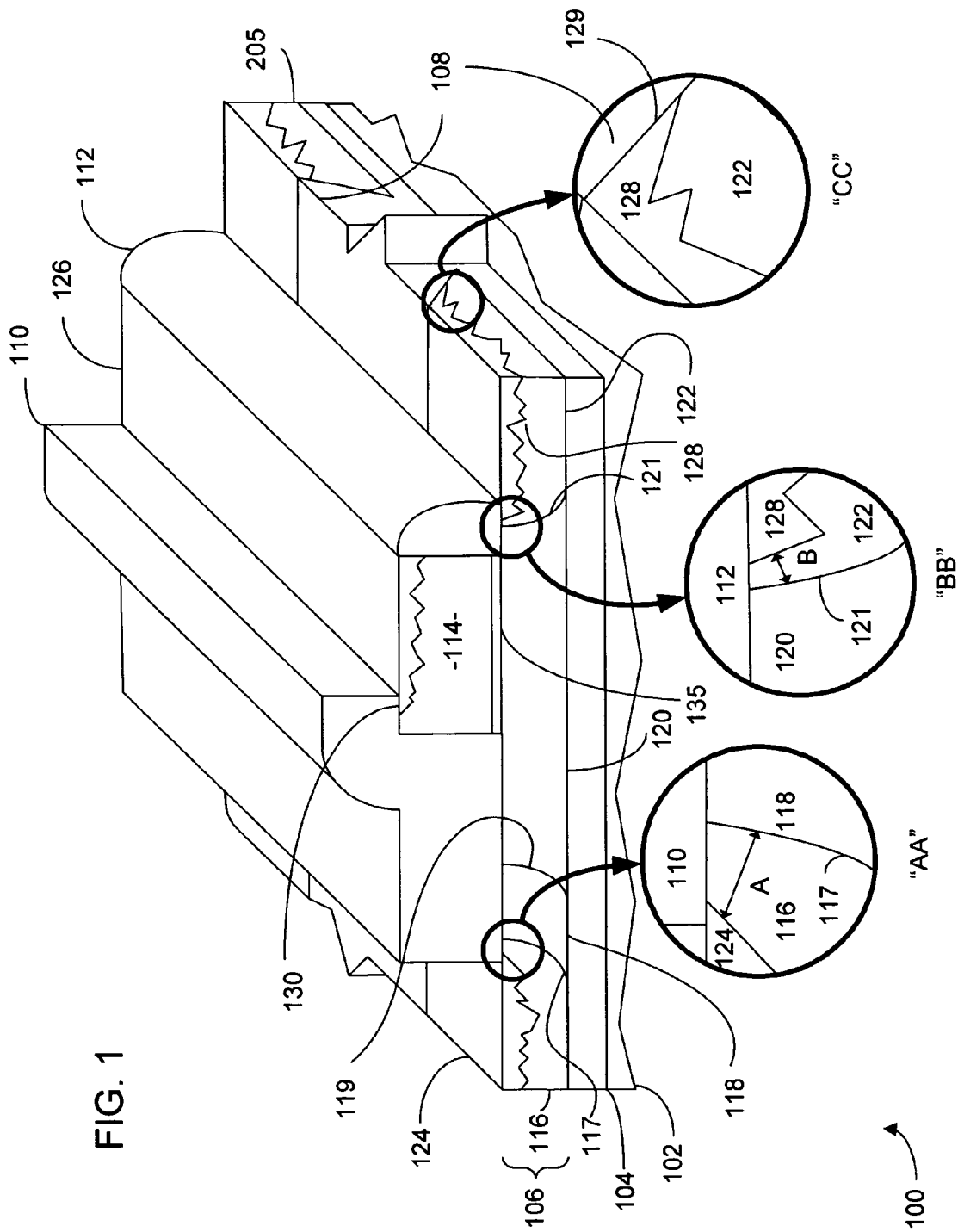
FIG. 1 is a sectional perspective of an exemplary section of a semiconductor wafer implementing a thin capacitively coupled thyristor ("TCCT"), including non-uniform silicide features.

It should be noted that the figures herein illustrate certain specific elements of particular-embodiments. Some background elements in the various figures presented herewith are for illustrational purposes only, and do not limit the scope of a given embodiment unless specifically stated in the specification.

DETAILED DESCRIPTION OF THE DRAWING

It is known that, under certain circumstances, the high temperature annealing of silicon can cause silicon migration with concomitant rounding over of sharp features, for instance top corner rounding ("TCR"). It is also know that the pre-amorphization implantation ("PAI") of certain ions, including but not necessarily limited to germanium ions (Ge+), xenon ions, and other sufficiently heavy inert ions for forming an amorphized layer, may be used in the formation of silicides having improved lower boundary uniformity. As described and shown below, these two technologies may be combined to provide a morphology-controlled salicide for the reduction or elimination of the previously discussed problems in the fabrication of lateral bipolar transistor devices, including thyristor-based memory devices.

Figure 2A:
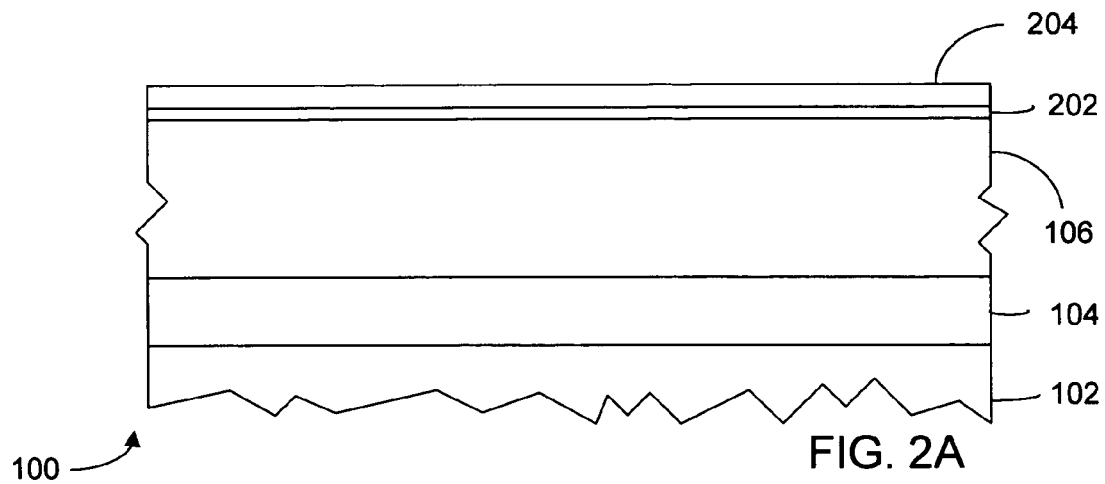

A methodology for forming a microcircuit device including one or more morphology-controlled silicides is shown having reference to FIGS. 2A-2M. As these morphology-controlled silicides may be self-aligned, they are sometimes referred to hereinafter as salicides. In FIG. 2A is shown a section of a microcircuit chip, in this example a silicon-on-insulator ("SOI") 100 wafer including a silicon substrate 102 and a layer of buried oxide ("BOx") 104 on silicon layer 102 and having formed thereon a silicon layer 106 is used. Formed on silicon layer 106 is a dielectric layer, such as silicon oxide 202, which has formed thereon another dielectric layer, such as silicon nitride 204. It should be noted that in one or more of the subsequent figures, silicon layer 102 is omitted for purposes of clarity.

Figure 2B:
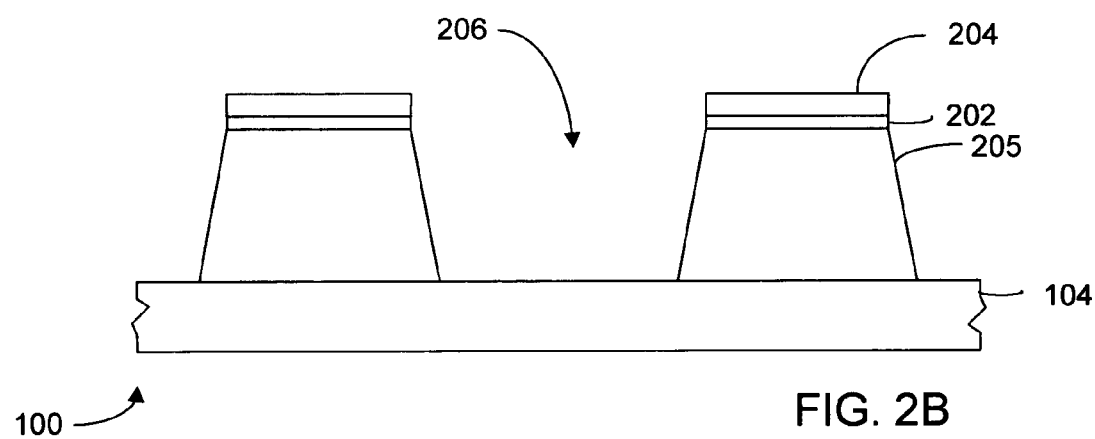

At FIG. 2B, the first of two etch operations is performed, thereby forming silicon rows 205 from silicon layer 106. In an embodiment, this shallow trench isolation ("STI") 206 was performed utilizing normal STI processes to a depth of approximately 100 nanometers ("nm") at an angle of approximately 82 degrees to form the retrograde wells. Alternative embodiments may be made with differing depths and angles for forming these retrograde wells. Further alternatives include differing trench geometries.

Figure 2C:
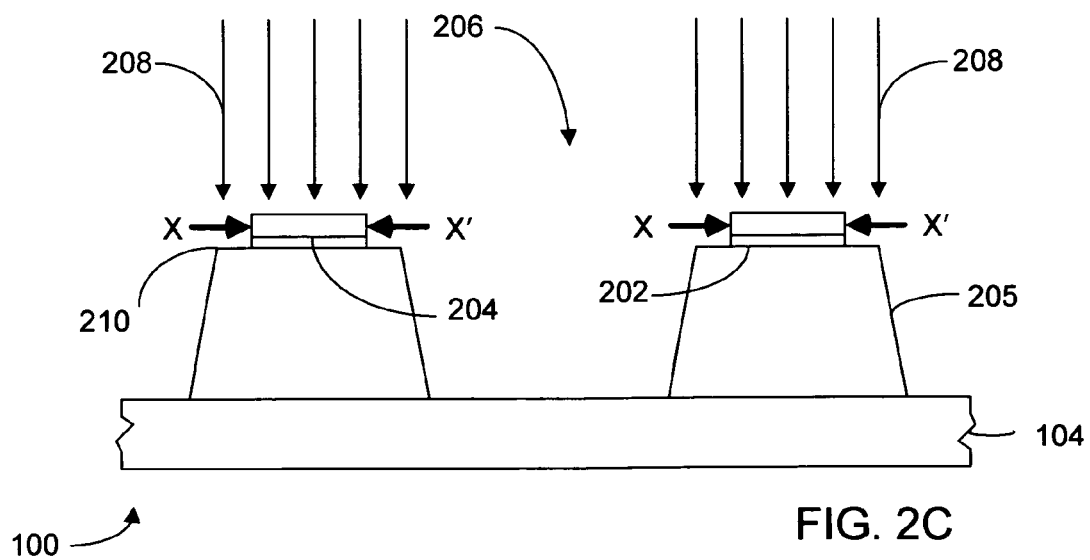

At FIG. 2C, a silicon nitride pullback or trim operation is performed to expose one or more corners 210 of silicon rows 205. This function may advantageously be performed utilizing a phosphoric acid etch, as at 208. This results in a nitride/oxide trim in the direction shown at X-X'. Alternative embodiments may use other known nitride etching processes in substitution of phosphoric acid etch 208. As a further alternative, a short HF wet etch, or an oxide trim or pullback leaving the nitride generally unaffected may be used.

Figure 2D:
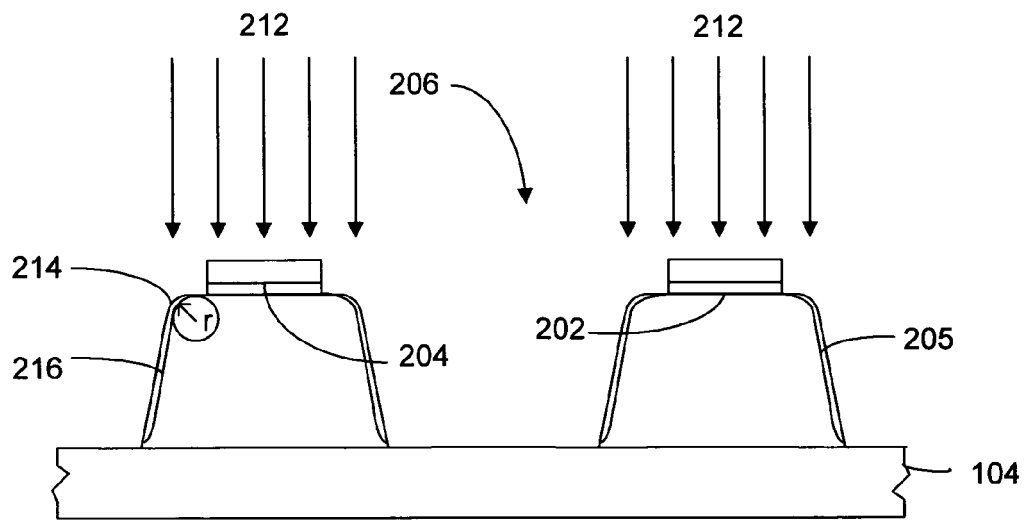

At FIG. 2D, a high temperature $H_2$ anneal operation 212 rounds the previously sharp edges of each corner 210 to form a rounded profile 214, having radius r. Differing $H_2$ annealing temperatures result in differing radii. In one embodiment the annealing, or top corner rounding operation, was performed in an $H_2$ ambient at approximately 380 torr for approximately 60 seconds. Temperatures from approximately 900° C. to approximately 950° C. yielded different and repeatable results. At approximately 925° C., a radius r of approximately 60 nm was formed. Because of the highly controllable nature of this process, alternative radii are easily formed.

With the formation of STI trench 206, and the top corner rounding performed at 214, the two-operation STI trench etch is completed. Thereafter, a layer of liner, or trench oxide 216, is grown on the exposed trench surfaces in the usual manner. In an embodiment, this oxidation was performed at approximately 1050° C., and resulted in an oxide approximately 100 angstroms ("Å") thick. Alternative oxide thicknesses may be implemented. It should be noted that for purposes of clarity, oxide 216 is omitted in one or more of the subsequent figures.

Figure 2E:
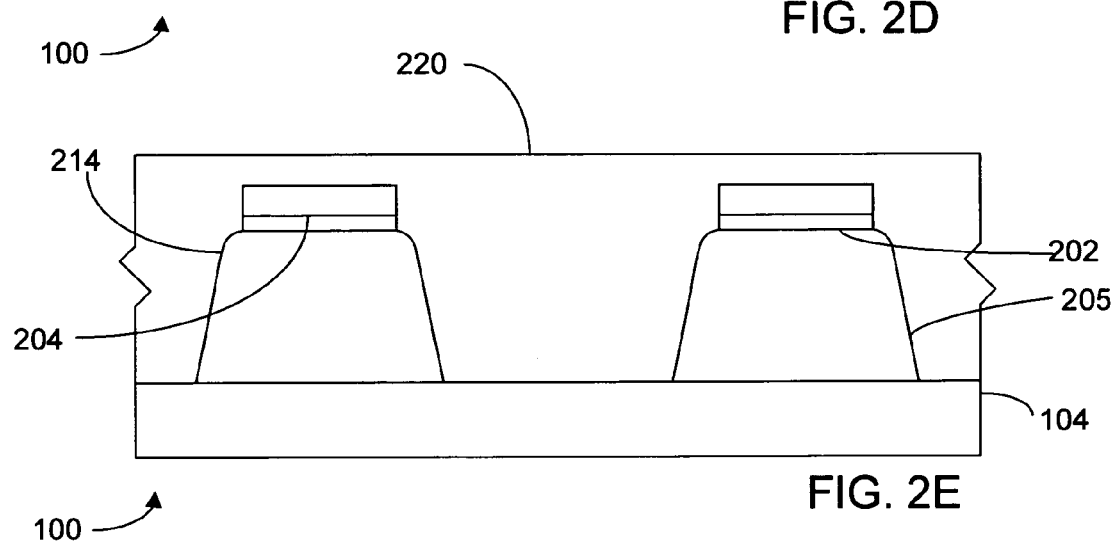

At FIG. 2E, trench fill 220 is effected utilizing known trench fill methodologies. In an embodiment, trench fill is accomplished utilizing $SiH_4/O_2$-based high density plasma technology. Alternatively, the chemical vapor deposition ("CVD") of tetraethoxysilane (TEOS), or other known fill techniques may be utilized, particularly where feature pitch is greater than 0.25 microns ("µm"), which is equivalent to a half-pitch greater than approximately 0.13 µm. Thereafter, in FIG. 2F, a planarization of fill material 220 is conducted utilizing nitride 204 as a stop. Planarization may conveniently be accomplished by means of chemical mechanical polishing ("CMP") or other planarization technologies well known to those having ordinary skill in the art.

Figure 2F:
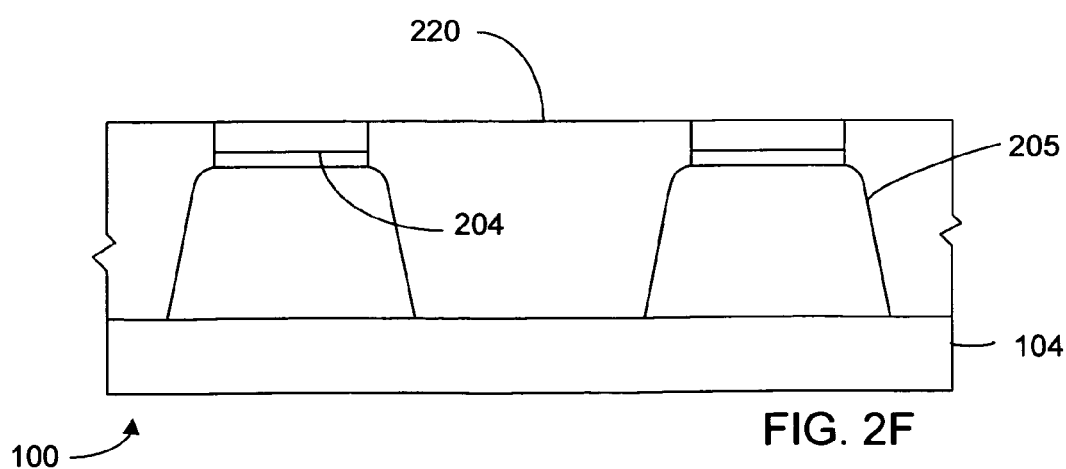
Figure 2G:
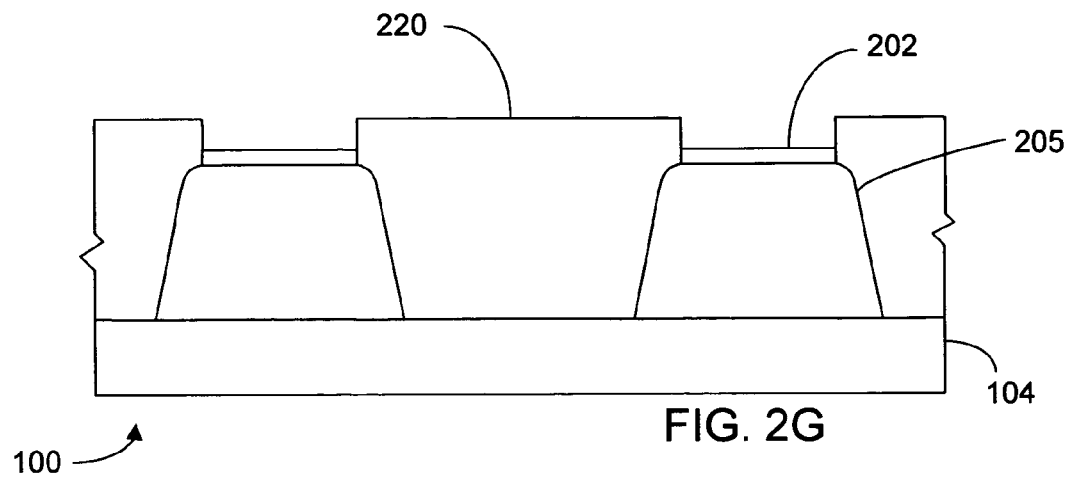

Subsequent to the planarization operation shown in FIG. 2F, nitride etch stop 204 is removed as shown in FIG. 2G. In an embodiment, a phosphoric acid etch is utilized to remove etch stop 204. Alternative embodiments contemplate the utilization of other known silicon nitride removal technologies.

Figure 2H:
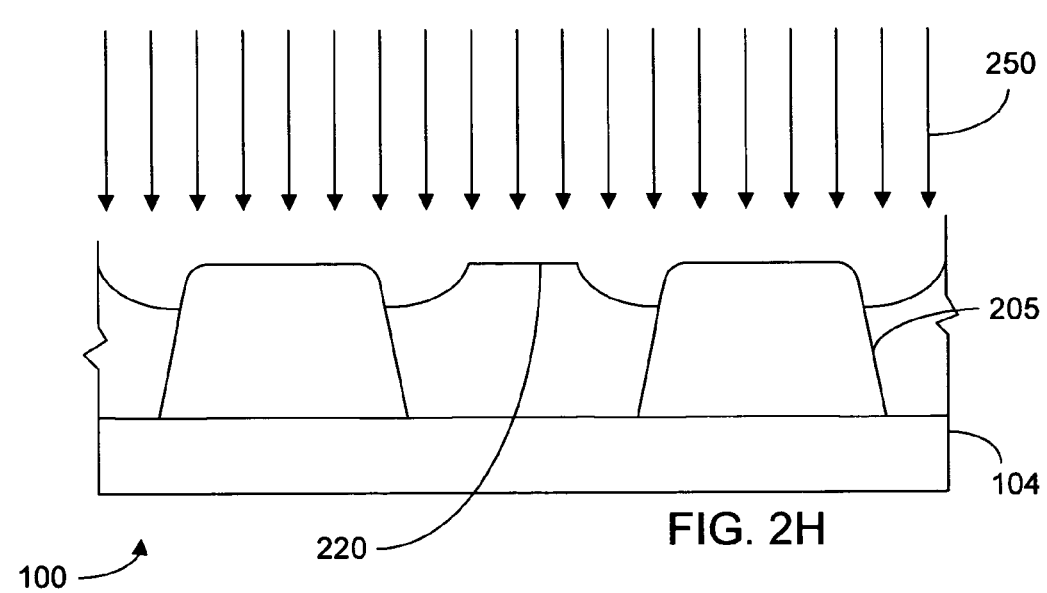

Following the previously discussed nitride removal, an isotropic etch 250 is performed, as shown in FIG. 2H. This figure shows that this isotropic etch operation serves to lower the overall height of the trench fill material 220, to remove oxide layer 202, and to draw down the fill level along the side of silicon row 205. A resulting profile is illustratively shown in FIG. 2H.

Figure 3:
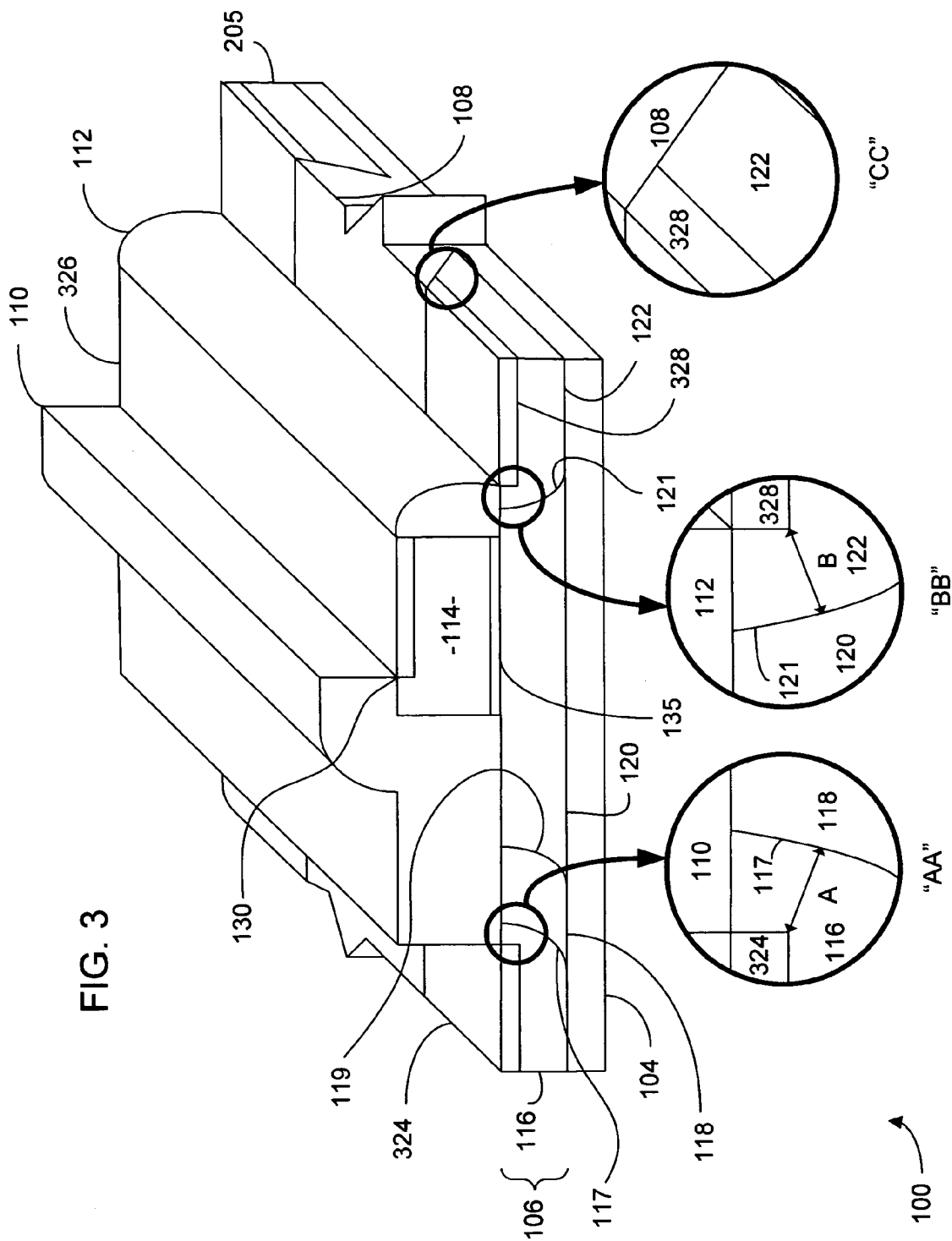
FIG. 3 is a sectional perspective of an exemplary section of a semiconductor wafer implementing a TCCT including improved silicide features.

Subsequent to the isotropic etch shown in FIG. 2H, wafer 100 is patterned and doped in the usual manner to form the several doped regions in silicon rows 205, e.g., 116, 118, 120, and 122 in FIG. 3. By way of illustration but not limitation, this patterning and doping may be done to produce a thyristor-based memory device. After the patterning and doping of silicon row 205, a high temperature source/drain ("S/D") activation anneal is accomplished in the normal manner. In an embodiment, S/D activation proceeded at approximately 1050° C. for approximately 10 seconds. Alternative anneal times and temperatures may be used.

Figure 2J:
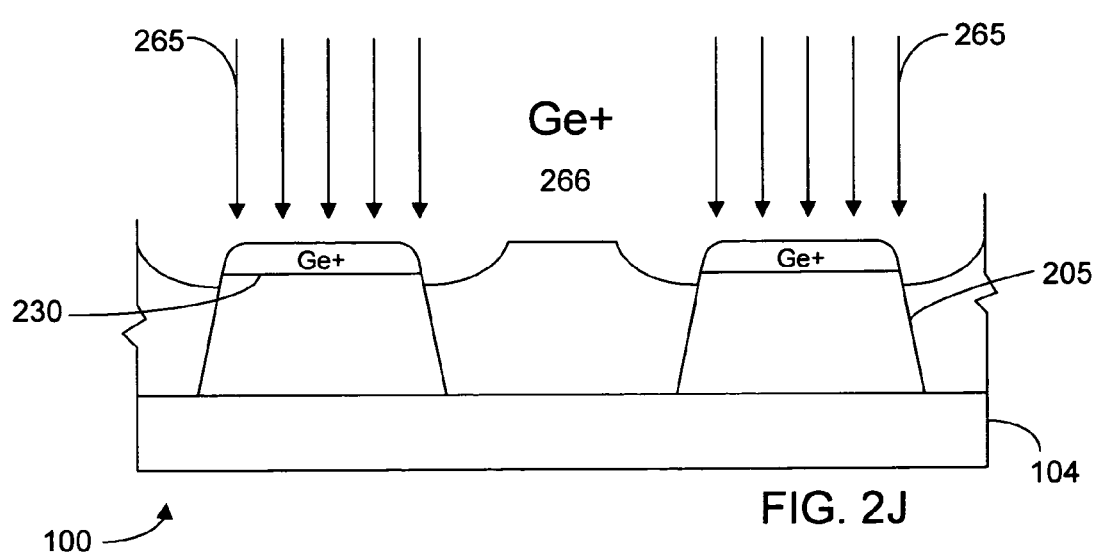

Once S/D activation has been accomplished, pre-amorphization regions are defined by patterning. Thereafter, as shown in FIG. 2J, a pre-amorphization implant 265 of germanium ion (Ge+) 266 is performed to embed a quantity of Ge+ 230 in these silicide regions. This pre-amorphization implant in one embodiment is performed at approximately $5 \times 10^{14}$ cm$^{-2}$ at approximately 40 keV. Alternative implant densities and power levels may be implemented. Additionally, while an embodiment uses germanium ion implants, xenon or other heavy ions capable of forming the amorphized layer may be used in alternative embodiments.

Figure 2K:
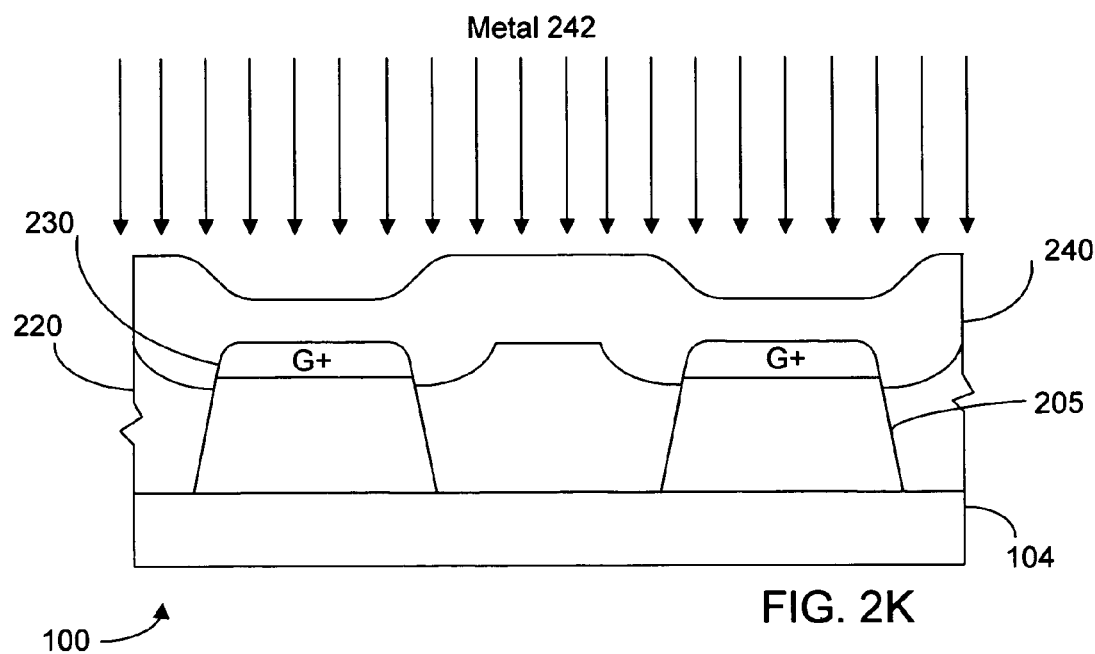

Referring now to FIG. 2K, following the previously discussed pre-amorphization implant of Ge+, a layer of metal is deposited on an upper surface of wafer 100. In an embodiment, cobalt was utilized, but alternative metals including, but not limited to tungsten, titanium, and cobalt may be utilized. In this embodiment, a layer 240 of cobalt 242 is deposited on an upper surface of wafer 100 in the usual manner.

Figure 2L:
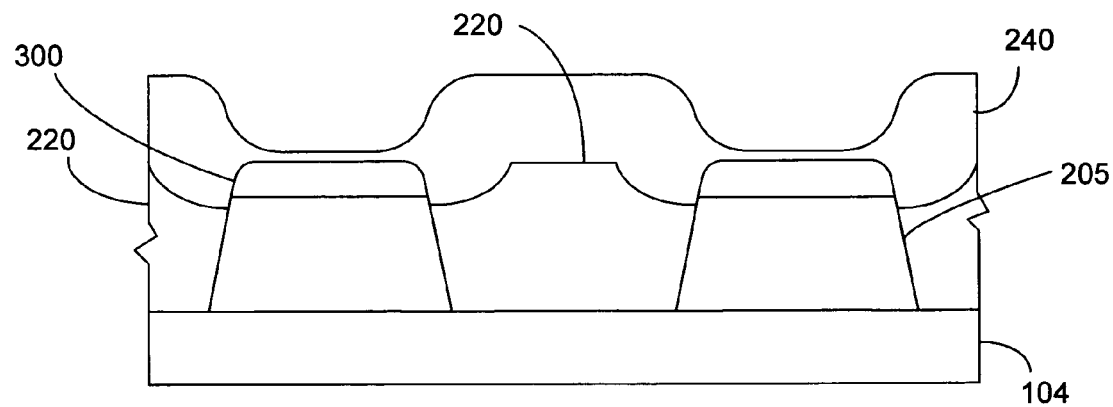
Figure 2M:
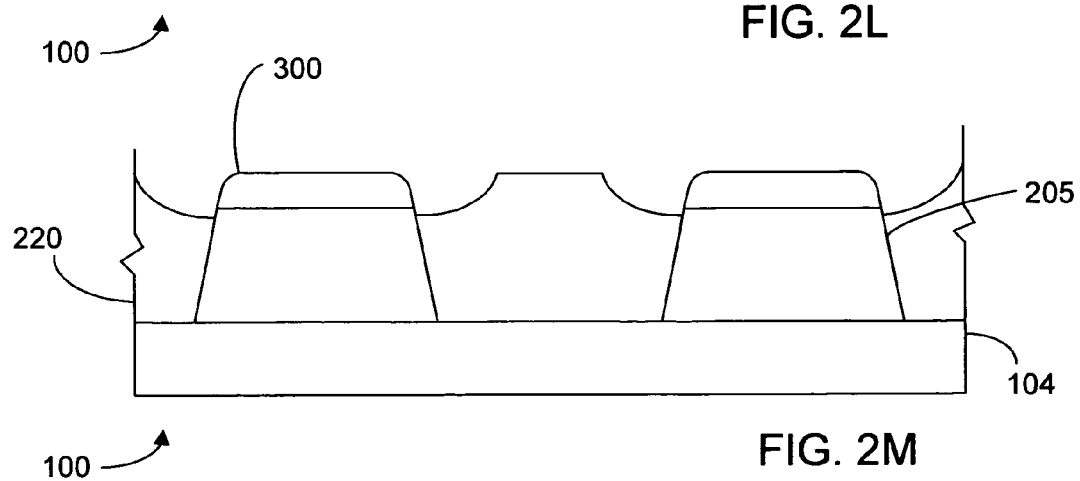

Once layer 240 is deposited, and as shown in FIG. 2L, cobalt layer 240 and the silicon of silicon rows 205 are reacted in the presence of the previously implanted Ge+ 230 to form silicide 300. This reaction is accomplished in the normal manner, but now results in the formation of a morphology-controlled silicide having enhanced uniformity from device-to-device, from die-to-die, and from wafer-to-wafer as described below. In FIG. 2M, any unreacted metal is removed in the usual manner, and wafer 100 is ready for annealing, contact formation processing, and other feature formation or processing as required.

A resultant device, including features formed subsequent to the previous discussion, is shown with reference to FIG. 3. Comparison of this figure with FIG. 1 shows the benefits of the formation of a morphology-controlled silicide as taught herein. Morphology-controlled silicides, e.g. 324, 326, and 328, are demonstrably more regular in form than the previously formed non-uniform silicides in FIG. 1, e.g. 124, 126, and 128. Notably, the degree of jagged lines in FIG. 1 contrasted with related lines in FIG. 3 is merely to illustratively show improved uniformity, which varies from implementation to implementation depending on actual process flows used. However, in contrast to prior salicides, a silicide formed herein may have a lower boundary thereof which is substantially planar; may have an outer border that does not extend as far along a boundary of neighboring structures, including junctions with dielectric fill material; and may have substantially less encroachment under adjoining structures.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A semiconductor device comprising:
   a plurality of rows defined in a semiconductor layer;
   at least one bipolar junction device formed on at least one of the plurality of rows, the at least one bipolar junction device having a first end region and a second end region;
   a quantity of a pre-amorphization ion implanted into at least one of the first end region and the second end region;
   a silicide formed in the semiconductor layer along an upper surface thereof and to a finite depth therebelow in the at least one of the first end region and the second end region having implanted therein the quantity of the pre-amorphization ion;
   at least one sidewall formed on at least one of the plurality of rows; and
   a rounded corner formed along the at least one sidewall and the upper surface of the semiconductor layer.

2. The semiconductor device of claim 1 further comprising:
   at least one gate conductive stripe formed substantially orthogonal to the plurality of rows; and
   the semiconductor layer being annealed to provide source/drain dopant activation prior to the implantation of the quantity of the pre-amorphization ion into the at least one of the first end region and the second end region.

3. The semiconductor device of claim 2 wherein the at least one bipolar junction device comprises one of an npnp and a pnpn structure, and wherein the pre-amorphization ion is one of germanium and xenon.

4. The semiconductor device of claim 3 wherein the one of the npnp and the pnpn structure further is for thyristor-based memory device.

5. A semiconductor device comprising:
   at least one row defined in a semiconductor layer, the at least one row defining at least one sidewall;
   at least one top corner defined by a sidewall of the at least one row and an upper surface of the semiconductor layer, the top corner having a rounded profile;
   at least one bipolar junction device formed in the at least one row;
   a quantity of a pre-amorphization ion implanted into a portion of the semiconductor layer partially defined by the upper surface and the top corner; and
   a silicide formed in the portion of the semiconductor layer and to a finite depth therebelow.

6. The semiconductor device of claim 5 wherein the at least one bipolar junction device comprises one of an npnp and a pnpn structure, and wherein the pre-amorphization ion is one of germanium and xenon.

7. The semiconductor device of claim 6 wherein the one of the npnp and the pnpn structure forms a thyristor-based memory device.

8. The semiconductor device of claim 7 further comprising:

at least one gate conductive stripe formed substantially orthogonal to the at least one row; and the semiconductor layer being annealed to provide source/drain dopant activation prior to the implantation of the quantity of the pre-amorphization ion into the portion of the semiconductor layer partially defined by the upper surface and the top corner.

* * * * *